(12) United States Patent
Harzanu et al.

(10) Patent No.: US 6,759,850 B2
(45) Date of Patent: Jul. 6, 2004

(54) SYSTEM AND METHOD FOR NON-CONTACT ELECTRICAL TESTING EMPLOYING A CAM DERIVED REFERENCE

(75) Inventors: Benyamin Harzanu, Nes Ziona (IL); Boris Roikhel, Herzlia (IL); On Haran, Kfar Saba (IL)

(73) Assignee: Orbotech Ltd., Yavne (IL)

(*) Notice: Subject to any disclaimer, the term of this patent is extended or adjusted under 35 U.S.C. 154(b) by 13 days.

(21) Appl. No.: 10/106,254

(22) Filed: Mar. 27, 2002

(65) Prior Publication Data

US 2003/0011380 A1 Jan. 16, 2003

Related U.S. Application Data

(60) Provisional application No. 60/279,122, filed on Mar. 28, 2001.

(51) Int. Cl.[7] ..................... G01R 31/08; G01R 31/28; G01R 31/302; G06G 7/62
(52) U.S. Cl. ..................... 324/522; 324/529; 324/530; 324/658; 324/750; 703/4
(58) Field of Search ..................... 324/522, 529–531, 324/537, 750, 260, 658; 703/2–6

(56) References Cited

U.S. PATENT DOCUMENTS

| | | | | |
|---|---|---|---|---|
| 4,613,866 A | * | 9/1986 | Blood | 342/448 |
| 5,218,294 A | * | 6/1993 | Soiferman | 324/158.1 |
| 5,424,633 A | | 6/1995 | Soiferman | 324/158.1 |
| 5,486,753 A | * | 1/1996 | Khazam et al. | 324/72.5 |
| 5,517,110 A | * | 5/1996 | Soiferman | 324/158.1 |
| 6,129,459 A | * | 10/2000 | Kishimoto et al. | 703/5 |
| 6,201,398 B1 | | 3/2001 | Takada | 324/537 |
| 6,337,571 B2 | * | 1/2002 | Maddala et al. | 324/754 |

FOREIGN PATENT DOCUMENTS

WO   WO 99/65287   12/1999

OTHER PUBLICATIONS

Delecki et al., *Near Field Receiving Properties of Printed Loop Antennas*, Canadian Conference on electrical and computer engineering, Congres Canadien en genie electrique et informatique, Montreal, PQ, Canada, Sep. 17–20, 1989.

Delecki et al., *Contactless Testing of Printed Circuit Boards*, Bulletin of Division of Electrical Engineering, vol. 3, No. 4, Ottawa, Canada, May 1990.

Delecki et al., *Electromagnetic Reactive Field Imaging of Printed Circuit Boards*; In syniopsium on Antenna Technology and Applied Electromagnetics, pp. 777–783, Winnipeg, Canada, Aug., 1990.

Delecki et al., *Equivalent Circuit of Small Receiving Antennas in Near Field*. In proceedings of the symposium on Antenna Technology and Applied Electromagnetics, pp. 772–776, Winnipeg, Canada, Aug., 1990.

Delecki et al., *Application of Electromagnetic Imaging in Industrial Testing*, In proceedings of Canadian Conference on Electrical and Computer Engineering, Quebec, Canada, Sep. 25–27, 1991.

Adamiak et al., *Electromagnetic Identification of Strip Coordinates of Printed Circuit Boards*, 1992.

* cited by examiner

*Primary Examiner*—Anjan K. Deb
(74) *Attorney, Agent, or Firm*—Sughrue Mion, PLLC

(57) ABSTRACT

A system and method for electrically testing electrical circuits in which electromagnetic values that are to be sensed by an array of sensors are forecast or simulated, for use as a reference, by calculation using computer files corresponding to a board under test and to an array of sensors.

38 Claims, 6 Drawing Sheets

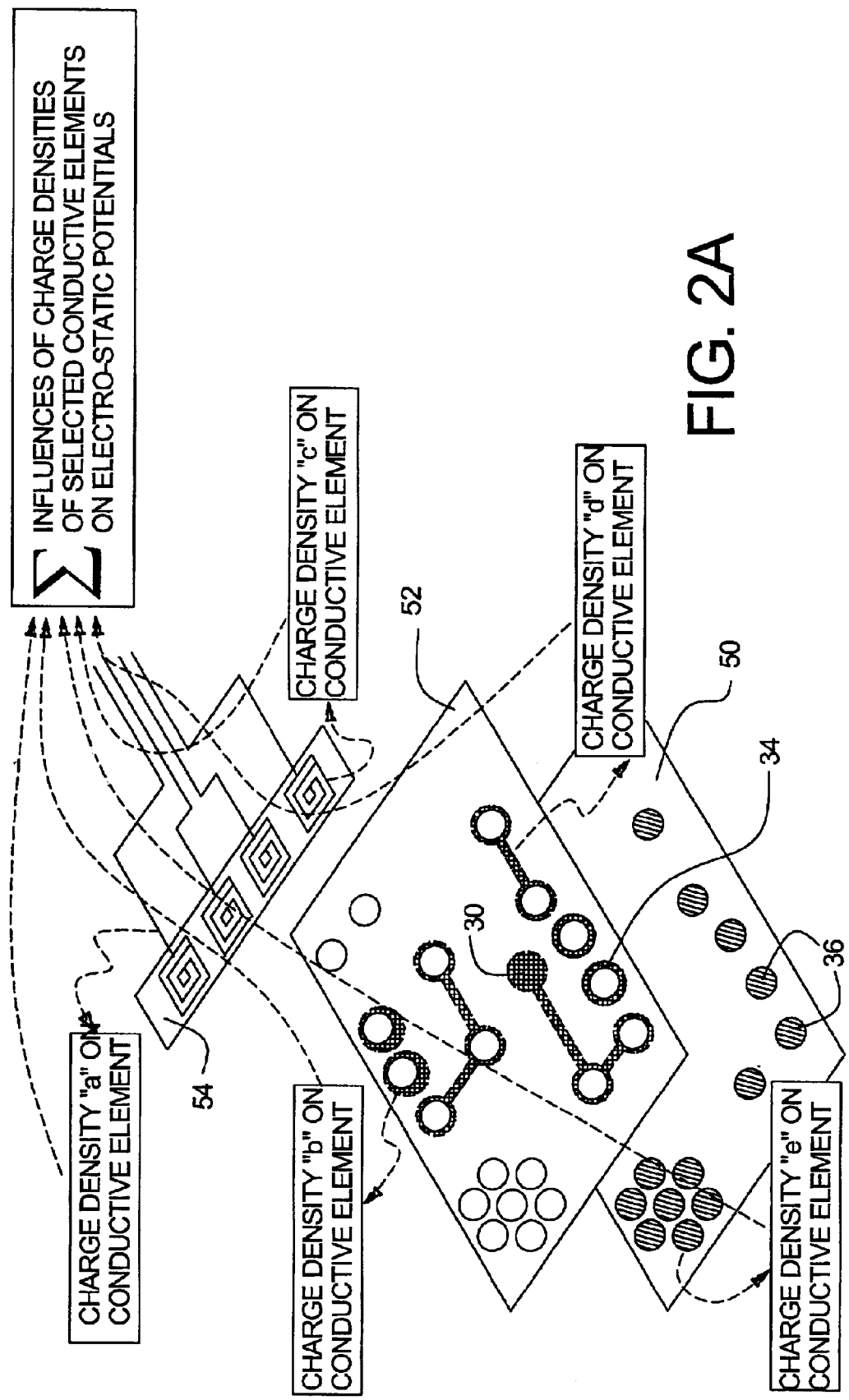

SYSTEM AND METHOD FOR NON-CONTACT ELECTRICAL TESTING EMPLOYING A CAM DERIVED REFERENCE

CROSS-REFERENCE TO RELATED APPLICATIONS

This application claims the benefit of commonly owned U.S. Provisional Application No. 60/279,122, filed Mar. 28, 2001, which is incorporated by reference, herein, in its entirety.

FIELD OF THE INVENTION

The following invention generally relates to systems and methods employed in the electrical testing of printed circuit boards and more particularly to systems and methods for generating a map of electrical signals that correspond to electrical signals to be received by sensors during the electrical testing of printed circuit boards.

BACKGROUND OF THE INVENTION

It is well known to test printed circuit boards and various other electrical circuit substrates for electrical defects.

The following U.S. patents describe systems and methods for non-contact electrical testing of printed circuit boards: U.S. Pat. Nos. 5,517,110, 5,218,294, 5,424,633 and 6,201,398, each of which is incorporated herein by reference.

The following published PCT patent application describes additional systems and methods for non-contact electrical testing of printed circuit boards: WO 99/65287, corresponding to copending U.S. patent application Ser. No. 09/719,753, incorporated herein by reference.

In systems for the inspection and/or testing of printed circuit boards a reference is employed to assist in determining whether a tested printed circuit board has been fabricated with a defect.

Various software tools for simulating electromagnetic fields are commercially available. These tools include, for example, packages available from Vector Fields Ltd. of Oxford, England and from Ansoft Corporation of Pittsburgh, Pa. These commercially available tools offer methodologies which are highly accurate when simulating electromagnetic fields and signals for small systems. However these commercially available tools are not suited for preparing references that are readily usable to perform non-contact electrical testing of complicated printed circuit boards, inter alia because they do not produce results that are readily usable in electrical testing systems and because they are much too resource intensive to be used for simulating electromagnetic fields on an entire printed circuit board during inspection.

SUMMARY OF INVENTION

The present invention seeks to provide systems and methods useful for simulating sensed electromagnetic values, such as an electrical current at a plurality of sensors positioned in proximity to an electro-magnetically stimulated article. These simulated electromagnetic values are compared with corresponding electromagnetic values sensed during electrical testing in order to detect defects. Embodiments of the invention are particularly suited for forecasting electro-magnetic values that are usable in the testing of electrically stimulated printed circuit boards. The sensors may be positioned in a fixed array relative to a board under test (BUT), or scanned across the BUT, in order to generate a collection of values representative of the BUT.

As used in this description, the term BUT means any suitable article to be tested, including, but not limited to, printed circuit boards, multi-chip modules, hybrid circuits, flat panel displays and semiconductor devices.

In accordance with a broad aspect of the invention, a reference of forecast electromagnetic values are calculated using computer files employed during the manufacture of the PCBs or other devices. The computer files include files that correspond, respectively, to a BUT and to an array of sensors employed to electrically test the BUT. Alternatively and additionally, a first portion of the forecast values are calculated using computer files containing information that corresponds to a first spatial orientation between a BUT and the sensors, and a second portion of the forecast values are calculated using the computer files containing information that corresponds to a second spatial orientation between a BUT and the sensors. A sequential change in relative orientations between the computer files may be used to simulate scanning.

In accordance with a particular embodiment of the invention, a capacitance matrix is calculated, from computer files for (1) a BUT, (2) a sensor board including an array of sensors, and (3) other testing system parts arranged in a predetermined orientation relative to the BUT. Charge and/or current at various sensors on the sensor board is derived from the capacitance matrix. Sequential calculations are performed to account for changing respective orientations of the BUT, sensor board and other testing parts, which occur, for example during scanning. These calculations facilitate simulating the scanning of a BUT by an array of sensors.

In accordance with another particular embodiment of the invention, a capacitance matrix is calculated in reliance on an assumption that charge density is distributed in a given manner over an entire conductive element. A net forming part of an electrical circuit pattern may include several conductive elements, such as a pad, annular ring, via, trace and the like. Charge density however may be, and typically is, different for each conductive element on the BUT (including conductive elements on the same net) and in the testing system and thus needs to be calculated for each conductive element. The inventors have found, however, that by treating each conductive element as a unit, calculation of simulated signals at an array of sensors is significantly simplified. Surprisingly such assumptions render a reasonable approximation of the signals output by sensors when compared to actual measurements or computation using conventional methods, which rely on calculating an actual charge density at a multiplicity of elemental regions of an article.

In accordance with another particular embodiment of the invention it is assumed that the charge density over an entire conductive element is uniformly distributed on that conductive element. Optionally, it may be assumed that the charge density is distributed over a conductive element in accordance with a predetermined function, for example a function indicating that there is a charge density fall-off at some parts of a conductive elements, such as those conductive elements or parts which are located close to the end of a net.

In accordance with another particular embodiment of the invention, current at sensors is computed for an electromagnetically stimulated BUT by determining a voltage at various nets, and then computing current as a function of plate capacitance. Nets typically include several conductive elements. Moreover, some of the nets are located on the BUT and some of the nets are in the testing system.

In another particular embodiment of the invention, in addition to nets which are vertically aligned, the contribution to current of non-vertically aligned nets, and/or the contribution to current of fringe fields between stimulators and sensors optionally are taken into consideration.

Fringe fields are affected, inter alia, by the geometry of nets on a BUT. In a particular embodiment of the invention comprising a scanning testing system, the geometry of nets affecting fringe fields changes due to the change of the relative position between a BUT and the testing system. Thus, the contribution of fringe fields as a result of these dynamic changes in geometry is factored into the calculation of current at sensors in the testing system.

In accordance with another particular embodiment of the invention, charge, voltage, current, or other electro-magnetic characteristic, is calculated for a sequence of mutual orientations between a printed circuit board under test on the one hand, and the sensor board and other system parts on the other hand. The sequence of orientations corresponds to sampling intervals during transportation of a BUT through an electrical testing system. Optionally, transportation of the BUT may be accounted for, and calculated, parametrically. The calculated values are collected into a map of values which can be used as a reference in an electrical testing system.

BRIEF DESCRIPTION OF DRAWINGS

The present invention will be understood and appreciated more fully from the following detailed description, taken in conjunction with the drawings in which:

FIGS. 2A and 2B are simplified pictorial illustrations of a methodology for preparing a test reference from CAM files, usable in the context of FIG. 1;

DETAILED DESCRIPTION OF THE PREFERRED EMBODIMENTS

Figure 1:
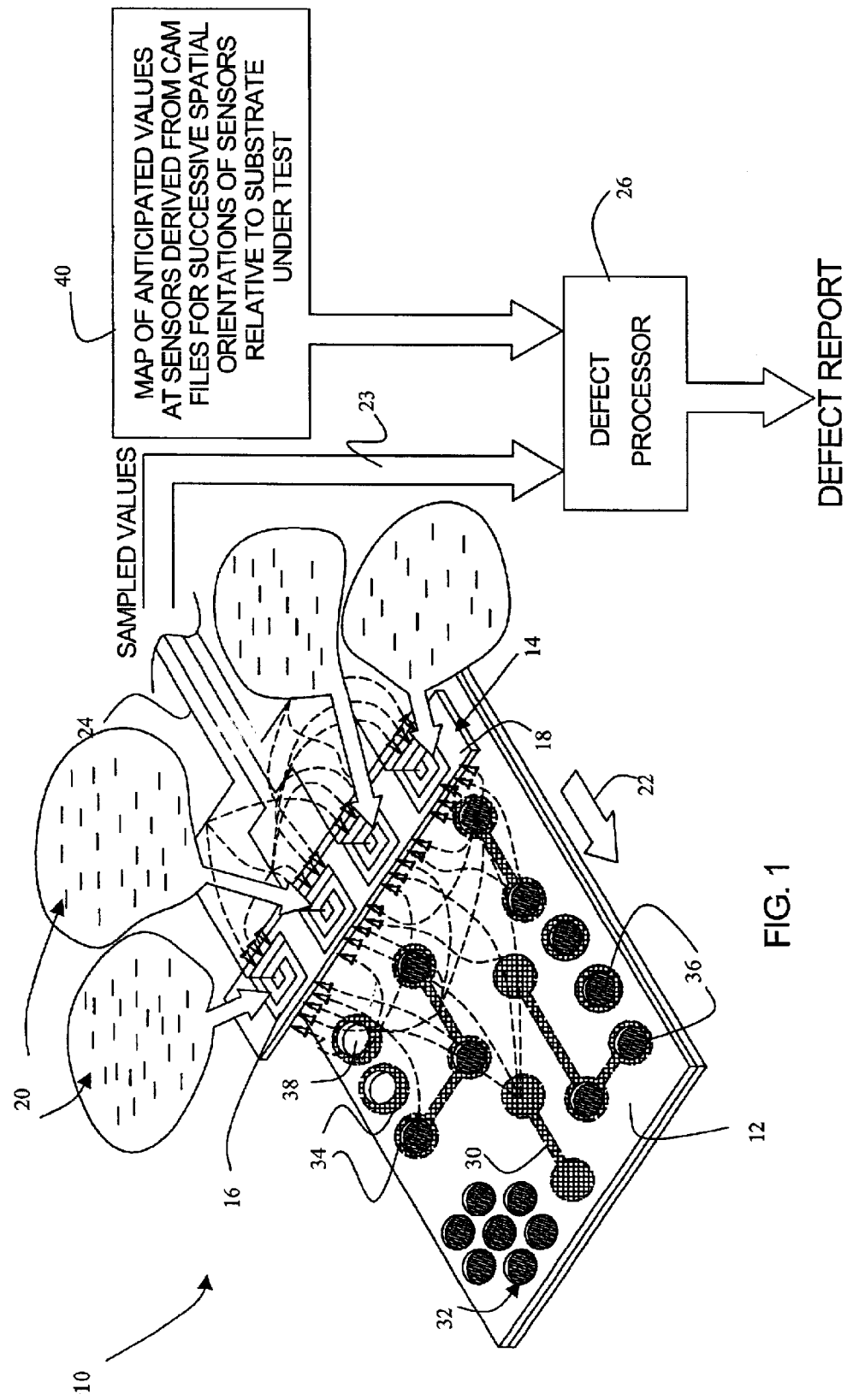
FIG. 1 is a simplified pictorial illustration of a system for electrically testing printed circuit boards in accordance with a preferred embodiment of the present invention.

Reference is made to FIG. 1, which is a simplified pictorial illustration of an electrical testing system, generally designated 10, for electrically testing a BUT 12 in accordance with an embodiment of the present invention.

In accordance with an embodiment of the invention, BUT 12 is electrically stimulated, for example with AC electrical stimulation signals. Stimulation may be applied by any suitable contact or non-contact means for applying electrical stimulation (not shown). An electrical characteristic is sensed by any suitable contact or non-contact sensing means. An example of a suitable system for the non-contact electrical testing of electrical circuits is described in Applicants' copending U.S. patent application Ser. No. 09/719,753, the description of which is incorporated herein by reference in its entirety.

As seen in FIG. 1, system 10 includes an array 14 of sensor elements 16, disposed on a sensor board 18. Sensor elements 16 are operative to sense an electromagnetic characteristic, such as charge, current or potential, generally designated reference numeral 20. In accordance with an embodiment of the invention, the electrical current is measured at each of sensor elements 16 at a predetermined time interval, called a sampling interval, while array 14 is scanned across the surface of BUT 12, for example in the direction indicated by arrow 22.

Sampled values 23, which in an embodiment of the invention are measured values of current, but which may be any other measurable electrical characteristic, are output via sensor circuitry 24 to a defect processor 26. A preferred system and method for electrically testing BUTs is generally described in Applicants copending U.S. patent application Ser. No. 09/719,753.

In the embodiment of the invention seen in FIG. 1, BUT 12 is a printed circuit board formed of two layers. It is noted however that in actuality BUTs may comprise, and typically do comprise, a quantity of layers greater than two. BUT 12 seen in FIG. 1 comprises various conductive elements, including conductors 30, via holes 32, annular rings 34 surrounding via holes 32, landing pads 36 beneath via holes 32, and through holes 38. Conductive elements that are connected together form nets. When BUT 12 is electrically stimulated, an electrical charge accumulates on various conductive elements, for example conductors 30, annular rings 34 and landing pads, and its influence on BUT 12 can be sensed by any suitable contact or non-contact sensing means Moreover, each of sensors 14 and other conductive parts of sensor board 18 also may, and typically do, accumulate a charge that needs to be accounted for.

It is a feature of the present invention that a map of anticipated values, generally designated by reference numeral 40, is derived for BUT 12. Map 40 generally comprises values relating to an electrical characteristic, for example values related to capacitance, potential or current, measured at sensors 16. In accordance with a particular embodiment of the invention, map 40 comprises anticipated, or forecast, values for current periodically measured at sensors 16, as a BUT 12 is scanned through system 10. Such values are calculated from CAM files which are employed in the manufacture of BUT 12 and from other computer files that represent BUT 12 and system 10. These other files include, for example, a net list listing interconnected conductive elements forming BUT 12 and files that represent array 14 and include, for example, a three dimensional model of array 14 as well as other parts of system 10.

It is noted that CAM files employed in the manufacture of BUT 12 may be provided in various formats, including for example, the Gerber format. Such CAM files typically indicate the location of metal pattern portions, the location of uncovered dielectric, mask layers and the like. Net lists may be in various formats, including for example the IPCD 356A format. Net lists define conductive parts which are operationally connected, such as pads that are interconnected by a conductor to form a net. The CAM files and net lists typically are part of a manufacturing file which is used to construct a printed circuit board of a given design. Together a collection of CAM files and a net list can be considered as defining, respectively, a three dimensional computer model of a BUT, a three dimensional computer model of an electrical testing system, or a three dimensional computer model of a closed system defined by a combination of a BUT and a testing system that is arranged in a given mutual orientation at a given instant in time. It is a feature of a particular embodiment of the present invention that such a computer model defining a BUT and an electrical testing system is used to calculate sampled sensor values in an electrical testing system, for example values that are output by sensors as a function of electromagnetic affects of the interaction between a stimulated BUT and the electrical testing system.

When stimulated, each of various conductive elements in system 10 and on BUT 12 develop a characteristic charge density. The charge density is influenced, inter alia, by the respective size, shape and relative locations of the various conductive parts in system 10 and on BUT 12, as well as by other parameters such as grounding of some elements. The charge density of each conductive element on BUT 12 may be, and typically is, different from the charge density of other conductive elements. These values can be calculated from a model including BUT 12 and system 10.

Inasmuch as the various conductive elements on BUT 12 and in system 10 accumulate a charge when stimulated, then for a given known applied stimulation, such as a charge, voltage or potential, and a given known spatial orientation between various conductive parts forming BUT 12 and system 10, then a value of a measurable electrical characteristic, such as capacitance or current, can be calculated for sensors 16.

It is noted that as a BUT 12 is scanned through system 10, the relative spatial orientations between the respective conductive elements on BUT 12 and in sensor board 18 change. Values, such as current, are measured, or sampled, at sensors 16 at predetermined sampling intervals, and collected to form a map of sensed values. Each row in the map corresponds to a given orientation existing between array 14 and BUT 12 at a moment in time when the values are sampled.

Suitable methodologies for producing a map of anticipated values 40 generally need to account for the dynamic interrelationships and changes in relative orientation between BUT 12 and system 10 that occur while scanning BUT 12 through system 10. These interrelationships can be very complicated, inasmuch as a BUT may be formed of several layers, conductive elements may be interconnected by nets passing through several layers, sensors may be affected by nets and/or conductive elements that are laterally offset, sensors may be affected by stimulators, and the effect of stimulators on sensors (fringe fields) may be affected by geometry of various nets and conductive elements.

In a particular embodiment of the invention a model of current values corresponding to current values expected to be measured at various sensors 16 is generated for comparison purposes. The charge density on various conductive elements on BUT 12 and in system 10 is calculated for each given orientation, in a sequence of mutual orientations, between BUT 12 and system 10 as BUT 12 is scanned through system 10. Each given orientation corresponds to an orientation between BUT 12 and system 10 present at a selected sampling interval. It is noted however, that as a BUT 12 is scanned through system 10, the respective distances between some conductive elements on BUT 12 and in system 10 change, while the respective distances between other conductive elements on BUT 12 and in system 10 remain constant. Thus, each respective mutual orientation between system 10 and BUT 12 in a sampling interval is treated as a separate computer model for the purposes of calculation.

As seen in FIG. 1, map 40 is supplied to defect processor 26, where it is used as a comparison reference to analyze a detection output defined by sampled values 23 acquired for BUT 12 and to determine whether defects are present on BUT 12. Typical defects (not shown) that may be detected on BUT 12 include shorts and opens, defects affecting electrical characteristics such as transmission or isolation at predetermined locations, defects affecting impedance and other manufacturing defects. The functionality of determining the presence of defects by comparing a sensed value of an electrical characteristic to a reference value of the electrical characteristic is described in greater detail in Applicants' copending U.S. patent application Ser. No. 09/719, 753.

Figure 2B:
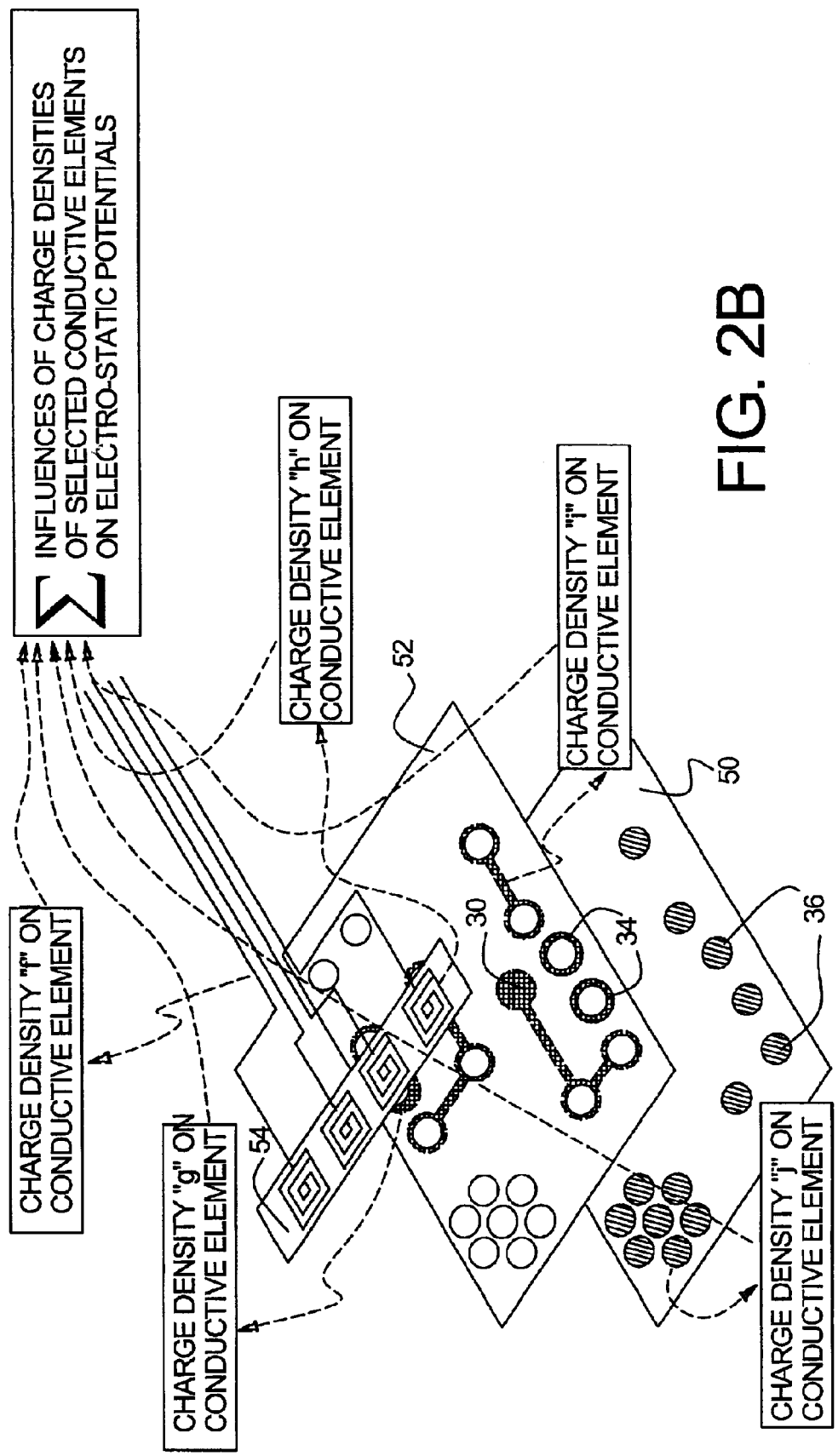
Figure 3:
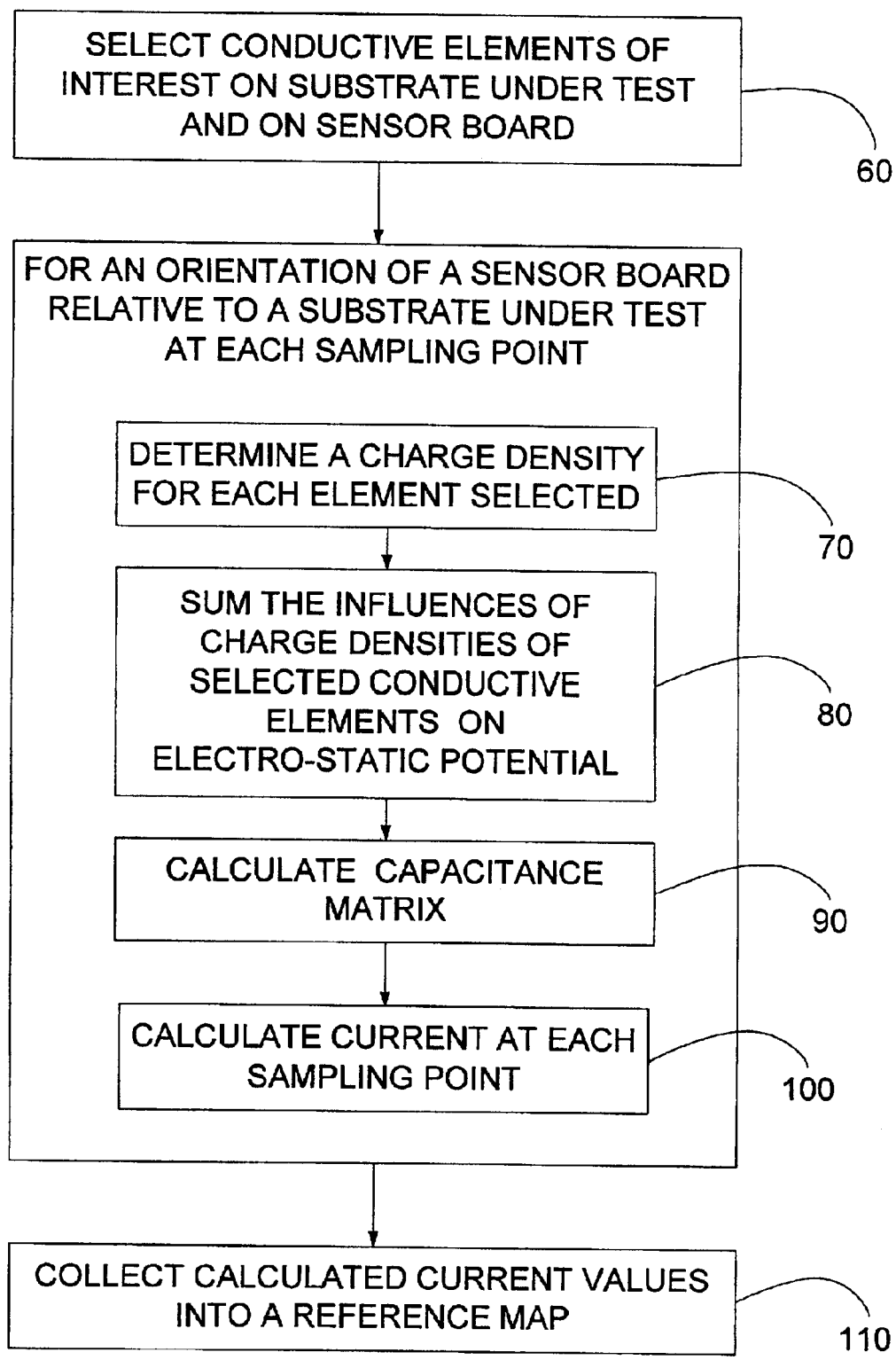
FIG. 3 is a simplified flow diagram of a method for calculating current values from CAM files in accordance with a preferred embodiment of the invention.

Reference is now made to FIGS. 2A and 2B which are simplified pictorial illustrations showing a methodology, in accordance with an embodiment of the invention for preparing a test reference, usable as map 40 (FIG. 1), from computer files, such as CAM files. Reference is also made to FIG. 3 which is a simplified flow diagram of a method, in accordance with an embodiment of the invention, for calculating from computer files anticipated, or forecast, current values corresponding to current values to be sensed by sensors 16 during the electrical testing of a BUT 12. Seen in FIGS. 2A and 2B are a first CAM file 50 representing a lower layer of BUT 12 (FIG. 1) and a second CAM file 52 representing an upper layer of BUT 12. As noted above, the CAM files 50 and 52 each indicate a spatial location of a conductive metal portion and a spatial location of a dielectric. Typically a net list (not seen) is employed to indicate conductive elements that are in operative communication so as to form a three dimensional computer model BUT 12. In addition a third computer file 54, representing a computer model of sensor board 18, is seen. The third computer file 54 includes, for example, CAM files and net lists defining sensor board 18.

It is seen that FIGS. 2A and 2B generally are identical except in the relative position of computer file 54 in relation to CAM files 50 and 52 respectively. Computer files 50–54 may be discrete files as shown; alternatively they may be three dimensional computer models. The change in position of CAM files 50 and 52 relative to computer file 54, as seen in the difference between FIGS. 2A and 2B, is indicative of scanning BUT 12 in the direction of arrow 22 in FIG. 1.

The respective value of current expected to be found at a sensor 16 (FIG. 1) corresponding to a location in map 40 can be derived using various numerical methods. In accordance with an embodiment of the invention a numerical method employing a capacitance matrix is used to forecast values of current expected to be found at each sensor 16, when computer files 50–54 correspond to a given orientation between the various conductive elements on BUT 12, and various other conductive elements associated with sensor board 18. The capacitance matrix represents respective influences of charge densities of selected conductive elements on electro-static potentials. In an embodiment of the invention, the capacitance matrix accounts for influences of conductive elements that are arranged in vertical alignment as well as those conductive elements that are not in vertical alignment.

As is known, charge "Q", from which other values such as current may be determined, can be derived from the equation:

$$\phi = PQ \qquad [1]$$

Where $\phi$ is an applied potential, and P is the inverse of a capacitance matrix C.

In general, a capacitance matrix may be calculated using the following boundary equation defining a charge density at a conductive element:

$$\phi(r) = \int_s \sigma(r') G(r,r') ds' \qquad [2]$$

Where:
S is the surface of the conductor r'∈S, ds'=ds(r'), r∈ℜ³
σ is the charge density on the conductor surface; and
G(r, r') is the appropriate Green's function. In the present context:

$$G(r, r') = \frac{1}{4\pi\varepsilon_o\varepsilon_r|r - r'|} \quad [3]$$

Where ε is the permittivity constant and r–r' is a distance between elements that are electrostatically influencing each other.

In accordance with an embodiment of the invention, conductive elements of interest, such as conductors 30, annular rings 34, landing pads 36 are selected in files 50 and 54. Such selected conductive elements of interest typically are not an entire net, but a part of a net. Additionally, conductive elements of interest in file 54, for example for sensor elements 14 and other circuitry located on sensor board 18, are also selected (operation 60). The selection of conductive elements of interest may be according to any suitable set of parameters. Typically, only those conductive elements which have measurable affect are selected, while conductive elements whose affect is negligible are omitted. A net list (not shown) can be helpful in making this selection, and the selection may be made manually or automatically.

For a first relative orientation of BUT 12 in relation to sensor board 18 and other selected parts of system 10, seen for example in FIG. 2A, a charge density is determined for each selected conductive element (operation 70). In accordance with an embodiment of the invention, each selected conductive element, such as a conductor 30, annular ring 34, landing pad 36 or sensor 16 is treated as a unit. The influence of the charge densities of the various selected elements on electrostatic potential, wherein the charge is provided by electromagnetic stimulation, is summated (operation 80) in accordance with the following equation:

$$\phi(r) = \sum_{k=1}^{N} \int_{S_k} \sigma(r_k)G(r, r_k)ds_k = \frac{1}{4\pi\varepsilon_o\varepsilon_r}\sum_{k=1}^{N}\int_{S_k}\frac{\sigma(r_k)}{|r - r_k|}ds_k \quad [4]$$

Where N is the number of conductive elements being considered.

It is a feature of an embodiment of the present invention that a capacitance matrix is calculated based on an assumption that the charge distribution over the entire surface of a conductive element, such as a conductor 30, annular ring 34, landing pad 36 or sensor 16, behaves according to a predetermined function. For the sake of simplicity of calculation, in an embodiment of the invention the distribution of charge density over each conductive element is assumed to be uniform and constant over the entire conductive element. It is appreciated that other more complex functions, for example taking into account fall off near the edges of a conductive element, or a net, may be used. By making such assumption, each conductive element can be treated as a unit, such that, as seen in FIGS. 2A and 2B, each conductive element has a particular charge density associated with it.

The inventors have found that these assumptions relating to the nature of charge density distributed on a conductive element and limitation of the conductive elements considered, although not necessary, significantly reduce the number of calculations, and computational resources, that are required to forecast a characteristic electrical value at sensors 16, while providing a usable forecast result.

Assuming that the charge density σ($r_k$) is constant, then for an k=1, . . . , N.

$$\sigma(r_i) = \sigma_i = const \; \forall r_i \in S_i.$$
$$r = r_i \in S_i, i=1, \ldots, N.$$

The summation of influences of the respective charge densities on selected conductive elements is:

$$\phi_i = \frac{1}{4\pi\varepsilon_o\varepsilon_r}\sum_{k=1}^{N}\frac{1}{A_iA_k}\int_{S_i}\int_{S_k}\frac{1}{|r_i - r_k|}ds_ids_kQ_k, \; i = 1, \ldots, N \quad [5]$$

Where:
$A_i = A(S_i)$ is the area of the surface $S_i$, i=1, . . . , N.

The result of equation [5] is placed into matrix form to calculate a capacitance matrix (operation 90):

$$\begin{pmatrix} \phi_1 \\ \phi_2 \\ \cdots \\ \phi_N \end{pmatrix} = \begin{pmatrix} p_{11} & p_{12} & \cdots & p_{1N} \\ p_{21} & p_{22} & \cdots & \cdots \\ \cdots & \cdots & \cdots & \cdots \\ p_{N1} & \cdots & \cdots & p_{NN} \end{pmatrix} \begin{pmatrix} Q_1 \\ Q_2 \\ \cdots \\ Q_N \end{pmatrix} \text{ or}$$

$\phi = PQ$ (which is equation [1]);

Where:

$$p_{ik} = p_{ki} \quad [6]$$
$$= \frac{1}{A_iA_k}\int_{S_I}\int_{S_K}G(r_i, r_k)ds_ids_k$$
$$= \frac{1}{4\pi\varepsilon_o\varepsilon_r}\sum_{k=1}^{N}\frac{1}{A_iA_k}\int_{S_I}\int_{S_K}\frac{1}{|r_i - r_k|}ds_ids_k, \; i, k = 1, \ldots, N$$

In order to solve each value of the above capacitance matrix, it is assumed that although each conductive element has a different charge density, each of the conductive elements on a given net has a uniform potential.

It is noted that some conductor nets may be grounded and other conductor nets may be unconnected. Thus the potential ø may be unknown for some nets. With respect to nets for which the potential ø is not known, the charge Q for that net is assumed to be 0. Using the above capacitance matrix, current is calculated for each sampling point, namely at a location corresponding to each sensor along a sensor board 18 in FIG. 1 (operation 100), according to a given orientation between sensor board 18 and BUT 12.

Current values may be individually computed for each relative orientation between BUT 12 and system 10 in a sequence of mutually changing orientations between BUT 12 and the other parts of system 10. The values at a location corresponding to a sensor in each of the sequence of mutual orientations of computer files 50–54, simulating scanning, are then collected to provide a reference map (operation 110). Optionally, the progression of BUT 12 through system 10 may be parameterized (only the values of "r" are affected) in accordance with preexisting knowledge of the geometries of the respective selected conductive elements and computed.

As noted above, the use of a capacitance matrix to forecast current at a sensor 16 is an example of a suitable numerical method for calculating current. Another numerical method that can be employed in an embodiment of the invention is suitable, for example, to calculate current at sensors in a non-contact electrical testing system comprising a positive stimulator and a negative stimulator separated by an array of sensors, generally as described in copending U.S. patent application Ser. No. 09/719,753. The current at a sensor can be forecast by calculation from computer files of a BUT 12 and an electrical testing system 10 (or a computer model including BUT 12 and system 10) using the following equation, in which a net, comprising several conductive elements, serves as its fundamental computational element:

$$i = j\omega \sum_{net} C_{net,sensor} \left( \frac{V_{stim}(C_{net,+} - C_{net,-}) + \sum C_{net,adjacent\_nets} * V_{adjacent\_nets}}{C_{net,ground} + C_{net,+} + C_{net,-} + \sum C_{net,adjacent\_nets}} \right) \quad [7]$$

Where:

i is the value of anticipated current at a given sensor;

j is a measured phase shift in current relative to the phase of the positive stimulator;

ω is 2*Π times the frequency of stimulation

C is capacitance calculated for a pair of metal elements, the respective pair of metal elements being indicated in the subscript; and V is voltage.

Subscripts indicate as follows: a net (generally including all of the conductive elements comprising a net), a sensor, positive stimulator or negative stimulator;

In accordance with an embodiment of the invention employing equation [7], it is noted that capacitance can determined, for example, by the equation:

$$C = \frac{A\varepsilon}{d} \quad [8]$$

Where:

A is the area of a plate (for example a net is considered to be a plate for the purposes of computation);

ε is the permittivity constant; and d is the distance between two plates

Moreover, in accordance with an embodiment of the invention, each of the nets is treated as a separate unit, and both capacitance and voltage are individually ascertained for net or pair of nets affecting current. In an embodiment of the invention, various nets in a three dimensional computer model of a BUT 12 and sensor board 18, including those which are in vertical alignment and those which are not-vertically aligned are summed in equation [7].

It is thus noted that by using equation [8] to calculate capacitance in equation [7], the necessity of calculating charge density, as for equations [1]–[6], for each conductive element is avoided. Equation [7] requires the calculation of capacitance for various pairs of metal elements. This can be accurately performed using numerical tools that solve differential equations in 3D media, as known in the art, e.g. using tools available from Ansoft Corporation of Pittsburgh, Pa. Alternatively, different approximations such as the plate parallel approximation, or the use of formulas from literature can also be used to solve for capacitance.

It is further noted that equation [7] requires that the voltage at various nets be accounted for. Optionally voltage in the numerator of equation [7] can be ignored in order to simplify calculation, at the cost of reduced accuracy in forecasting current i. In accordance with an embodiment of the invention, a uniform voltage on a conductive element is assumed, and current is forecast using capacitance calculated for a set of nets.

In accordance with a particular embodiment of the invention, equation [7] is used to directly calculate current expected at each sensor 16 in a sensor board 18 (FIG. 1) using a computer model generated from files 50–54 (FIGS. 2A and 2B) and arranged so as to correspond to a mutual spatial orientation between sensor board 18 and BUT 10, and a net list. A value for distance between various nets can be calculated from information relating to the thickness of layers in a BUT which is contained in CAM files and/or other manufacturing records. The current expected at each sensor 16 is calculated for various sequential orientations, or parametrically, in order to stimulate scanning.

It is noted that equation [7] is a restatement of Ohm's law, in an expanded form. Thus in accordance with an embodiment of the invention, equation [7] may be further expanded by adding an expression $$j\omega C_{+,sensor}(V) + j\omega C_{(-),sensor}(-V)$$

to account for the contribution of a positive stimulator and a negative stimulator (not shown) to current on a sensor, such as are used in a system as described in Applicants' copending U.S. patent application Ser. No. 09/719,753. It is noted that in such contribution, fringe fields may be affected by the geometry of BUT 12 when in a given orientation relative to sensor board 18, at a given moment in time associated with a sampling interval.

By suitably separating sensors 16 from stimulators (not shown) in an electrical testing system 10, or by electrically isolating sensors from stimulators and the contribution of stimulators to capacitance can be made negligible and thus ignored. A choice of the measure of separation between stimulators and sensors is a matter of design choice, inasmuch as the relative distance between stimulators and sensors generates a plate capacitor on the one hand, or affects the minimum size of a conductive element that can be detected. In accordance with a particular embodiment of the invention, each of the stimulators are split in order to provide the option of using relatively close together stimulators which may result in a plate capacitor, or relatively far away stimulators which avoid the formation of a plate capacitor, but which may have reduced inspection capability.

In view of the foregoing, it is noted that by choosing a suitable numerical method for calculating a suitable electromagnetic characteristic at each of sensors 16, current can be calculated using information which is readily available or which can be readily derived, depending on the various configuration options for an electrical testing system.

Figure 4A:
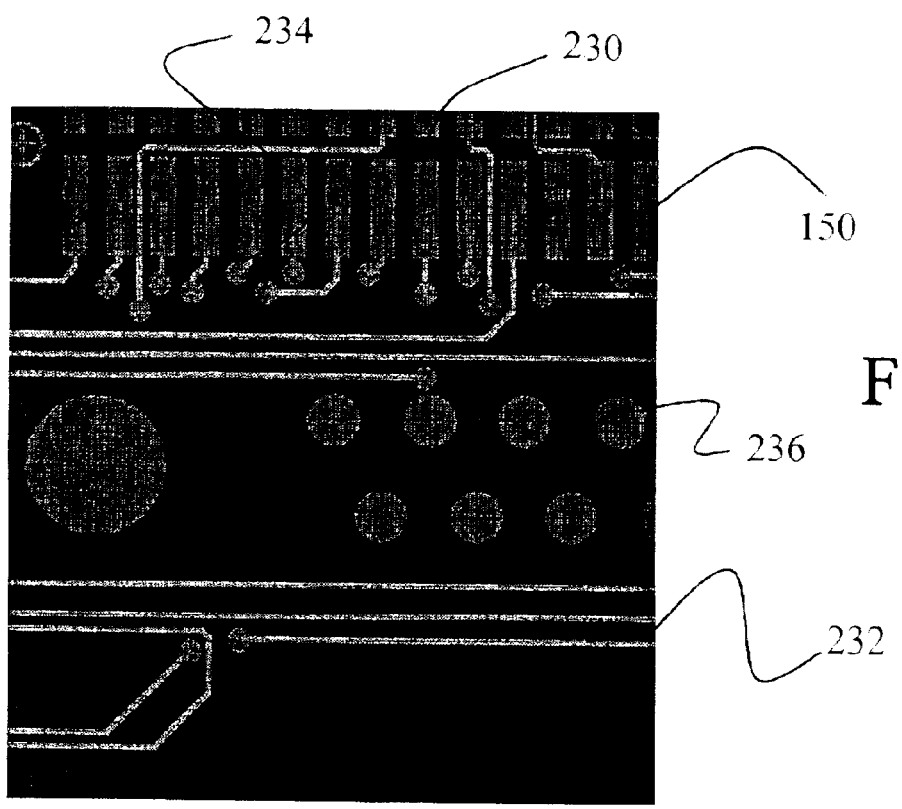
FIG. 4A is an illustration of a portion of a printed circuit board under test.
Figure 4B:
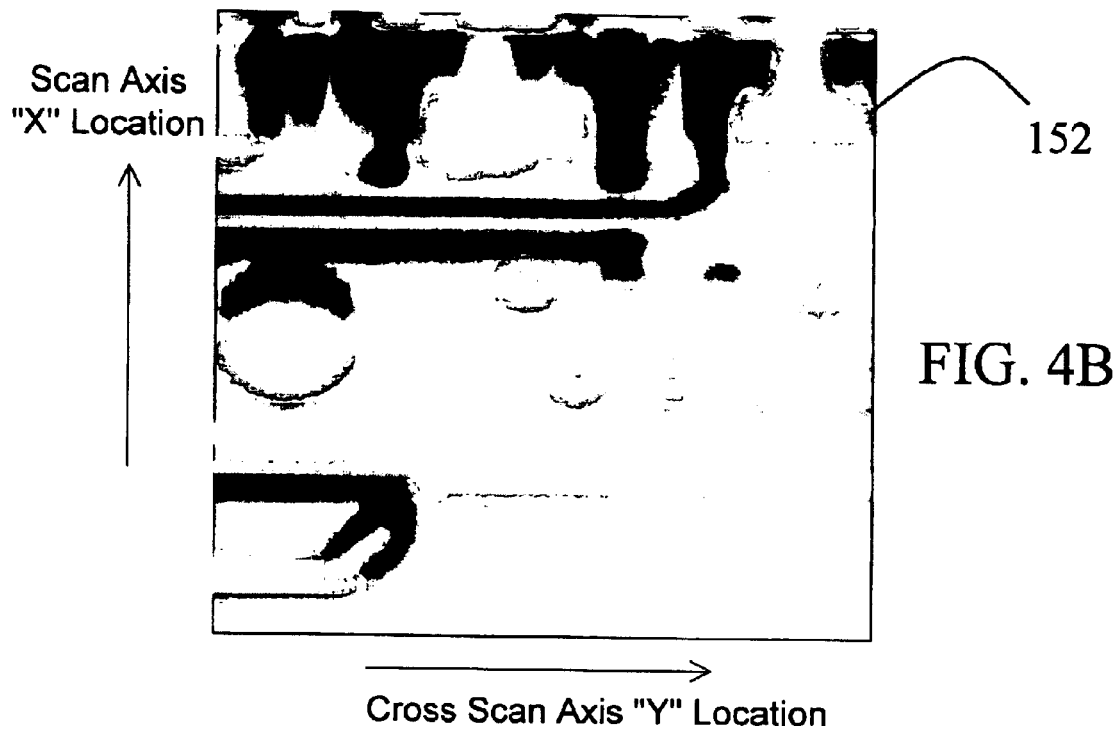
FIG. 4B is a visualization of sensed current values at a plurality of sensors scanned over the PCB of FIG. 4A in a non-contact electrical testing device.
Figure 4C:
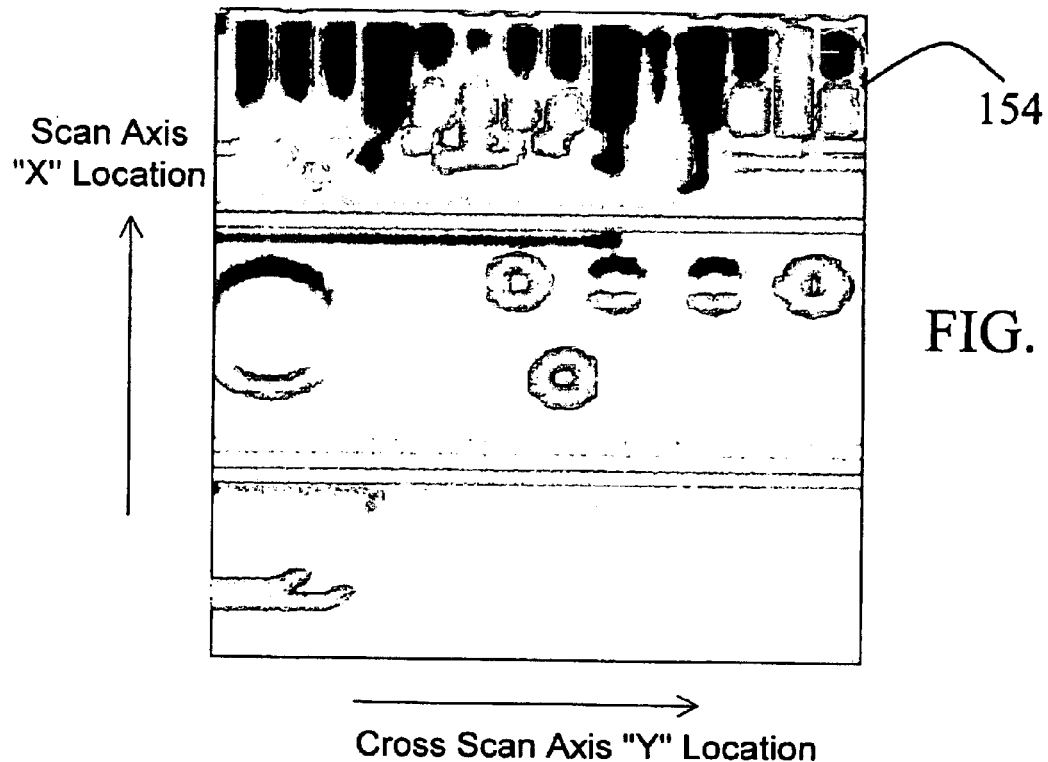
FIG. 4C is a visualization of calculated current values at a plurality of sensors that are calculated in accordance with an embodiment of the invention.

Reference is now made to FIG. 4A which is an illustration of a portion of a computer file of a printed circuit board under test, to FIG. 4B which is a visualization of sensed current values sampled at a plurality of sensors 16 scanned over the PCB of FIG. 4A in a non-contact electrical testing device, and to FIG. 4C which is visualization of current values at a plurality of sensors calculated in accordance with a preferred embodiment of the invention. Various conductive elements are seen in portion 150, including various pads 230, which are SMT (surface mount technology) type pads, conductors 232, annular rings 234 at the end of conductors 232, and plated through holes 236. As seen in FIG. 4A, portion 150 is a generally two dimensional projection of computer model of a composite of several Cam file layers, such as, for example a first CAM file 50 and a second CAM file 52 (FIGS. 2A and 2B).

FIG. 4B is a representation 152 of current at sensors 16 as an array 14 is scanned over a printed circuit board portion, corresponding to portion 150. Portion 140 has been stimulated by an electrical field, and the testing system is generally as described in Applicant's copending U.S. patent application Ser. No. 09/719,753. Representation 152 has been processed using MATLAB™ image processing tools, available from Mathworks of Natick, Mass., in order to associate gray scale values to various current strengths in a manner that facilitates visualization.

In FIG. 4B, the X axis indicates a cross-scan direction, such as an axis along which sensors 16 are disposed, and the Y axis indicates a scan direction, which corresponds to a direction of scanning. Regions of representation 152 which are gray in color correspond to portions of a BUT, for example at a dielectric substrate portion, which generally induce a zero, or near zero, current on a sensor 16. Regions of representation 152 which are light or white in color correspond to portions of a BUT which generally induce a positive current on a sensor 16. Regions of representation 152 which are dark or black in color correspond to portions of a BUT which generally induce a negative current on a sensor 16.

FIG. 4C is a representation 154 of current at sensors calculated from CAM files, such as portion 150 in FIG. 4A, in accordance with the methods described hereinabove, using a simulator incorporating equations [7] and [8]. Representation 154 has been processed using MATLAB™ image processing tools, available from Mathworks of Natick, Mass., in order to associate gray scale values to various current strengths in a manner that facilitates visualization.

The general similarity between representations 152 and 154 is noted. It is additionally noted that representations 152 and 154 are not identical, particularly inasmuch as representation 152 appears to have a higher definition as compared to representation 152. This difference between representations 152 and 154 is attributed to generating representation 154 in a manner that does not fully account for various physical affects articulated in the equations noted hereinabove, including, inter alia, non-vertical interactions between nets and sensors, and fringe fields such as interactions between sensors and stimulators, particularly fringe fields that are the result of changing interaction between nets and sensors as a result of simulating scanning.

Notwithstanding the differences between representations 152 and 154, the overall similarities between the representations indicate the usability of forecast values for current, calculated from computer files, such as CAM or CAD computer files, as a reference in an electrical testing system for electrically testing BUTs.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A tester for electrically testing a board under test (BUT) for defects, comprising:
 a sensor operative to provide detection outputs corresponding to a sensed electrical characteristic for selected locations on a BUT; and
 a defect processor configured to receive:
  said detection outputs, and
  a reference representing anticipated values corresponding to the detection outputs for the selected BUT locations, said reference including anticipated values that are calculated from information representing said BUT and that take into account an electric effect of said sensor; and
 said defect processor being operative to output an indication of a possible electrical defect in said BUT by comparing said detection outputs to said reference anticipated values.

2. The tester claimed in claim 1, wherein said BUT is a printed circuit board.

3. The tester claimed in claim 1, wherein said BUT is electrically stimulated prior to detection by said sensor.

4. The tester claimed in claim 1, wherein said sensor senses said BUT without coming into physical contact with said BUT.

5. The tester claimed in claim 1, wherein said sensed electrical characteristic is electrical current.

6. The tester claimed in claim 1, wherein said reference includes anticipated values calculated from a plurality of CAM files.

7. The tester claimed in claim 6, wherein said anticipated values are calculated from a computer file, wherein said computer file comprises a three dimensional model of said sensor.

8. The tester claimed in claim 1, wherein said reference includes anticipated values calculated from a computer file representing said sensor and from a CAM file representing a structure of the BUT, and wherein a first portion of said anticipated values is calculated when said CAM file is in a first spatial orientation relative to said computer file, and a second portion of said anticipated values is calculated when said CAM file is in a second spatial orientation relative to said computer file.

9. The tester claimed in claim 1, wherein an anticipated value is determined from a capacitance matrix calculated for selected conductive elements affecting said sensor.

10. The tester claimed in claim 9, wherein said capacitance matrix is calculated based on an assumption that a charge distribution for said selected conductive elements behaves according to a predetermined function.

11. The tester claimed in claim 10, wherein said predetermined charge distribution function is uniform for each selected conductive element.

12. A tester for electrically testing a board under test (BUT) for defects, comprising:
 a sensor operative to provide a detection output, said detection output including a sensed electrical characteristic for selected locations on a BUT; and
 a defect processor configured to receive:
  said detection output, and
  a reference representing anticipated values corresponding to an electrical characteristic to be sensed by said sensor at selected locations on the BUT, said reference including anticipated values calculated from at least one computerized CAM file representing a three dimensional model of said BUT and said sensor, and
 said defect processor being operative to output an indication of a possible electrical defect in said BUT in response to comparing said detection output to said reference.

13. The tester claimed in claim 12, wherein said BUT is a printed circuit board.

14. The tester claimed in claim 12, wherein each of the selected locations on said BUT is electrically stimulated while being sensed by said sensor.

15. The tester claimed in claim 12, wherein said sensed electrical characteristic is electrical current.

16. The tester claimed in claim 12, wherein said computer file further includes a net list representing nets on said BUT.

17. The tester claimed in claim 12, wherein anticipated values are calculated from said computerized CAM file, said computerized CAM file representing said BUT and including a three dimensional model of said sensor.

18. The tester claimed in claim 12, wherein an anticipated value is determined from a capacitance matrix calculated for selected conductive elements affecting said sensor, when said CAM file and said computer file are arranged to represent a predetermined spatial orientation between said BUT and said sensor.

19. The tester claimed in claim 18, wherein said capacitance matrix is calculated based on an assumption that a charge distribution for said selected conductive elements on the BUT acts according to a predetermined function.

20. The tester claimed in claim 19, wherein said predetermined charge distribution function is uniform for each selected conductive element.

21. The tester claimed in claim 12, wherein an anticipated value is determined from summing the affects of capacitance between nets having a given voltage, said capacitance calculated from a model including a CAM file and a computer file that are arranged to represent a predetermined spatial orientation between said BUT and said sensor.

22. A method for electrically testing a board under test (BUT) for defects, comprising:
   sensing a BUT with a sensor at a multiplicity of selected locations;
   outputting sensed values indicating an electrical characteristic sensed at the selected locations;
   comparing said sensed values to corresponding anticipated values, said anticipated values being calculated from a CAM file representing said BUT and information representing said sensor, said calculated values being calculated to take into account an electric effect of said sensor; and
   determining a defect in said BUT in response to said comparing.

23. The method claimed in claim 22, wherein said comparing comprises comparing anticipated values that are calculated from said CAM file and from said information according to at least one spatial orientation between said BUT and said sensor.

24. The method claimed in claim 22, wherein said comparing comprises comparing an anticipated value that is determined from a capacitance matrix calculated for selected conductive elements affecting said sensor.

25. The method claimed in claim 24, wherein said comparing comprises comparing an anticipated value determined from a capacitance matrix that is calculated based on an assumption that a charge distribution for said selected conductive elements acts according to a predetermined function.

26. The method claimed in claim 25, wherein said predetermined function is a uniform distribution of charge.

27. The method claimed in claim 22, wherein said comparing comprises comparing a sensed value of current to an anticipated value of current that is calculated as a function of capacitance between selected nets on said BUT.

28. A method for electrically testing a board under test (BUT) for defects, comprising:
   sensing a BUT with a sensor at a multiplicity of locations;
   outputting sensed values indicating an electrical characteristic sensed by said sensor at selected locations;
   comparing said sensed values to corresponding anticipated values, said anticipated values including values that are calculated from at least one computer file representing a three dimensional model of said BUT and said sensor; and
   determining a defect in said BUT in accordance with said comparison.

29. The method claimed in claim 28, wherein said comparing comprises comparing anticipated values that are calculated from at least one CAM file representing said BUT and at least one computer file representing said sensor.

30. The method claimed in claim 28, wherein said comparing comprises comparing an anticipated value that is determined from a capacitance matrix calculated for selected conductive elements affecting said sensor.

31. The method claimed in claim 30, wherein said comparing comprises comparing an anticipated value that is determined from a capacitance matrix that is calculated based on an assumption that a charge distribution for said selected conductive elements acts according to a predetermined function.

32. The method claimed in claim 31, wherein said predetermined function is a uniform distribution of charge.

33. The method claimed in claim 28, wherein said comparing comprises comparing a sensed value of current to an anticipated value of current that is calculated as a function of capacitance between selected nets on said BUT.

34. A method for calculating a reference map representing a BUT for use in an electrical tester having a plurality of sensors, comprising:
   calculating an electrical charge for selected conductive portions of a BUT using at least one computer file representing said BUT;
   calculating an electrical charge for selected sensors using a computer file representing said sensors;
   calculating electromagnetic values affected by selected conductive portions using the calculated electrical charge for said conductive portions of said BUT and the calculated electrical charge for said selected sensors, said electromagnetic values taking into account an electric effect of said selected sensors; and
   collecting the calculated electromagnetic values into a reference map.

35. A method for-calculating a reference map representing a BUT for use in an electrical tester having at least one sensor, comprising:
   (a) identifying various conductive portions on a BUT;
   (b) calculating a capacitance between a selected sensor and a selected conductive portion on the BUT;
   (c) multiplying said capacitance by a voltage;
   (d) summing the result of the multiplication in (c) with respect to a selected sensor for each of a plurality of selected conductive portions on the BUT, and multiplying said sum with a current phase to determine a value for current; and
   (e) collecting a plurality of current values calculated in (d) to form a reference map representing a BUT.

36. The method claimed in claim 35 and wherein operation (b) further comprises:
   calculating a capacitance between a selected sensor and another sensor.

37. The method claimed in claim 36 and further comprising changing a spatial orientation between a computer file representing said BUT and a computer file representing said sensor.

38. The method claimed in claim 35 and further comprising changing a spatial orientation between a computer file representing said BUT and a computer file representing said sensor.

* * * * *